(12) United States Patent
Jheng et al.

(10) Patent No.: US 12,265,334 B2
(45) Date of Patent: *Apr. 1, 2025

(54) OPTICAL PROXIMITY CORRECTION AND PHOTOMASKS

(71) Applicant: Taiwan Semiconductor Manufacturing Co., Ltd., Hsin-Chu (TW)

(72) Inventors: Dong-Yo Jheng, Hsinchu (TW); Ken-Hsien Hsieh, Taipei (TW); Shih-Ming Chang, Hsinchu (TW); Chih-Jie Lee, Hsinchu (TW); Shuo-Yen Chou, Hualien County (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,879

(22) Filed: Jul. 30, 2023

(65) Prior Publication Data

US 2023/0384691 A1 Nov. 30, 2023

Related U.S. Application Data

(63) Continuation of application No. 17/665,757, filed on Feb. 7, 2022, now Pat. No. 11,789,370, which is a (Continued)

(51) Int. Cl.
*G03F 1/36* (2012.01)
*G03F 7/00* (2006.01)

(52) U.S. Cl.
CPC ............ *G03F 7/70441* (2013.01); *G03F 1/36* (2013.01); *G03F 7/705* (2013.01)

(58) Field of Classification Search
CPC ........ G03F 7/705; G03F 7/70441; G03F 1/36; G03F 7/70125; G03F 7/70433;
(Continued)

(56) References Cited

U.S. PATENT DOCUMENTS 7,694,267 B1 4/2010 Ye et al.
8,732,625 B2 5/2014 Ye et al.
(Continued)

FOREIGN PATENT DOCUMENTS

TW I432887 4/2014
TW I520195 2/2016
TW I548932 9/2016

*Primary Examiner* — Binh C Tat
(74) *Attorney, Agent, or Firm* — HAYNES AND BOONE, LLP

(57) ABSTRACT

A method includes receiving a layout for fabricating a mask, determining a plurality of target contours corresponding to a plurality of sets of lithographic process conditions, determining a modification to the layout, simulating the modification to the layout under the plurality of sets of lithographic process conditions to produce a plurality of simulated contours, determining a cost of the modification to the layout based on comparisons between the plurality of simulated contours and corresponding ones in the plurality of target contours, and providing the modification to the layout for fabricating the mask based at least in part on the cost being within a predetermined threshold.

20 Claims, 11 Drawing Sheets

Related U.S. Application Data continuation of application No. 16/895,547, filed on Jun. 8, 2020, now Pat. No. 11,243,472, which is a continuation of application No. 16/057,277, filed on Aug. 7, 2018, now Pat. No. 10,678,142.

(60) Provisional application No. 62/585,914, filed on Nov. 14, 2017.

(58) Field of Classification Search
CPC .... G03F 1/70; G03F 7/70625; G03F 7/70558; G03F 7/70525; G03F 7/70666; G03F 7/70616; G03F 7/70258; G03F 7/70425; G03F 7/70483; G03F 7/70633; G03F 7/70641; G03F 1/44; G03F 7/7065; G03F 7/70508; G03F 1/24; G03F 1/68; G03F 7/70083; G03F 7/706; G03F 1/62; G03F 7/20; G03F 7/70066; G03F 7/70091; G03F 7/70141; G03F 7/70491; G03F 7/70575; G03F 7/70991; G03F 1/00; G03F 7/70516; G03F 7/70683; G03F 7/7085; G03F 1/20; G03F 1/26; G03F 1/38; G03F 1/42; G03F 1/50; G03F 1/72; G03F 1/88; G03F 7/2008; G03F 7/70116; G03F 7/70191; G03F 7/70866; G03F 9/7096; G03F 7/70658; G03F 1/84; G03F 7/701; G03F 7/70133; G03F 7/70291; G03F 7/70466; G03F 7/7055; G03F 7/70608; G03F 7/70675; G03F 7/70725; G03F 7/70891; G03F 1/78; G03F 7/105; G03F 7/2004; G03F 7/70025; G03F 7/70283; G03F 7/70308; G03F 7/70333; G03F 7/70375; G03F 7/70583; G03F 7/706839; G03F 7/706843; G06F 30/398; G06F 2119/18; G06F 30/20; G06F 30/00; G06F 30/39; G06F 17/10; G06F 30/392; G06F 30/30; G06F 30/27; G06F 30/367; G06F 30/33; G06F 2111/04; G06F 2111/06; G06F 2111/08; G06F 30/333; G06F 2119/22; G06F 30/31; G06F 2119/02; H01L 2027/11874; H01L 27/0207; H01L 23/528; H01L 21/027
USPC ..................................................... 716/50–56
See application file for complete search history.

(56) References Cited

U.S. PATENT DOCUMENTS

| | | | |
|---|---|---|---|
| 8,796,666 B1 | 8/2014 | Huang et al. | |
| 8,850,366 B2 | 9/2014 | Liu et al. | |
| 8,906,595 B2 | 12/2014 | Liu et al. | |
| 8,954,899 B2 | 2/2015 | Wu et al. | |
| 9,093,530 B2 | 4/2015 | Huang et al. | |
| 9,367,655 B2 | 6/2016 | Shih et al. | |
| 9,390,217 B2 | 7/2016 | Wang et al. | |
| 9,548,303 B2 | 1/2017 | Lee et al. | |
| 9,865,542 B2 | 1/2018 | Liaw et al. | |
| 9,870,443 B2 | 1/2018 | Huang et al. | |
| 10,678,140 B2 | 6/2020 | Banine et al. | |
| 10,678,142 B2* | 6/2020 | Jheng | G03F 1/36 |
| 11,243,472 B2* | 2/2022 | Jheng | G03F 1/70 |
| 11,789,370 B2* | 10/2023 | Jheng | G03F 1/70 |
| | | | 716/53 |
| 2007/0186206 A1* | 8/2007 | Abrams | G03F 1/36 |
| | | | 716/54 |
| 2008/0127027 A1* | 5/2008 | Gallatin | G03F 1/36 |
| | | | 716/52 |
| 2009/0307649 A1 | 12/2009 | Pramanik et al. | |
| 2013/0000505 A1 | 1/2013 | Tao et al. | |
| 2013/0219348 A1 | 8/2013 | Ye et al. | |
| 2013/0275926 A1 | 10/2013 | Wang et al. | |
| 2016/0162623 A1 | 6/2016 | Lutich | |
| 2016/0283617 A1 | 9/2016 | Bailey et al. | |
| 2017/0363950 A1 | 12/2017 | Sriraman et al. | |
| 2018/0157161 A1* | 6/2018 | Mailfert | G06F 30/367 |
| 2018/0314148 A1 | 11/2018 | Tetiker et al. | |

* cited by examiner

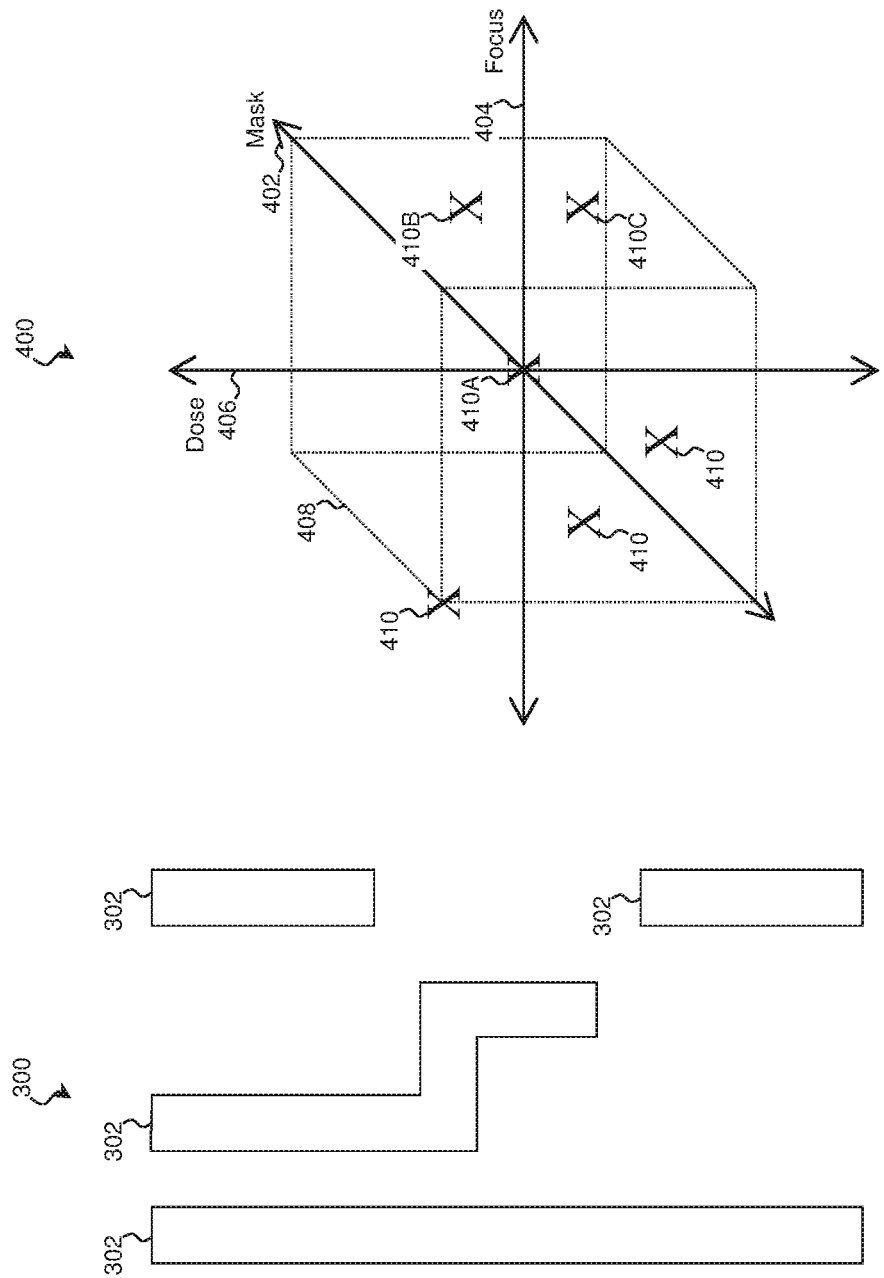

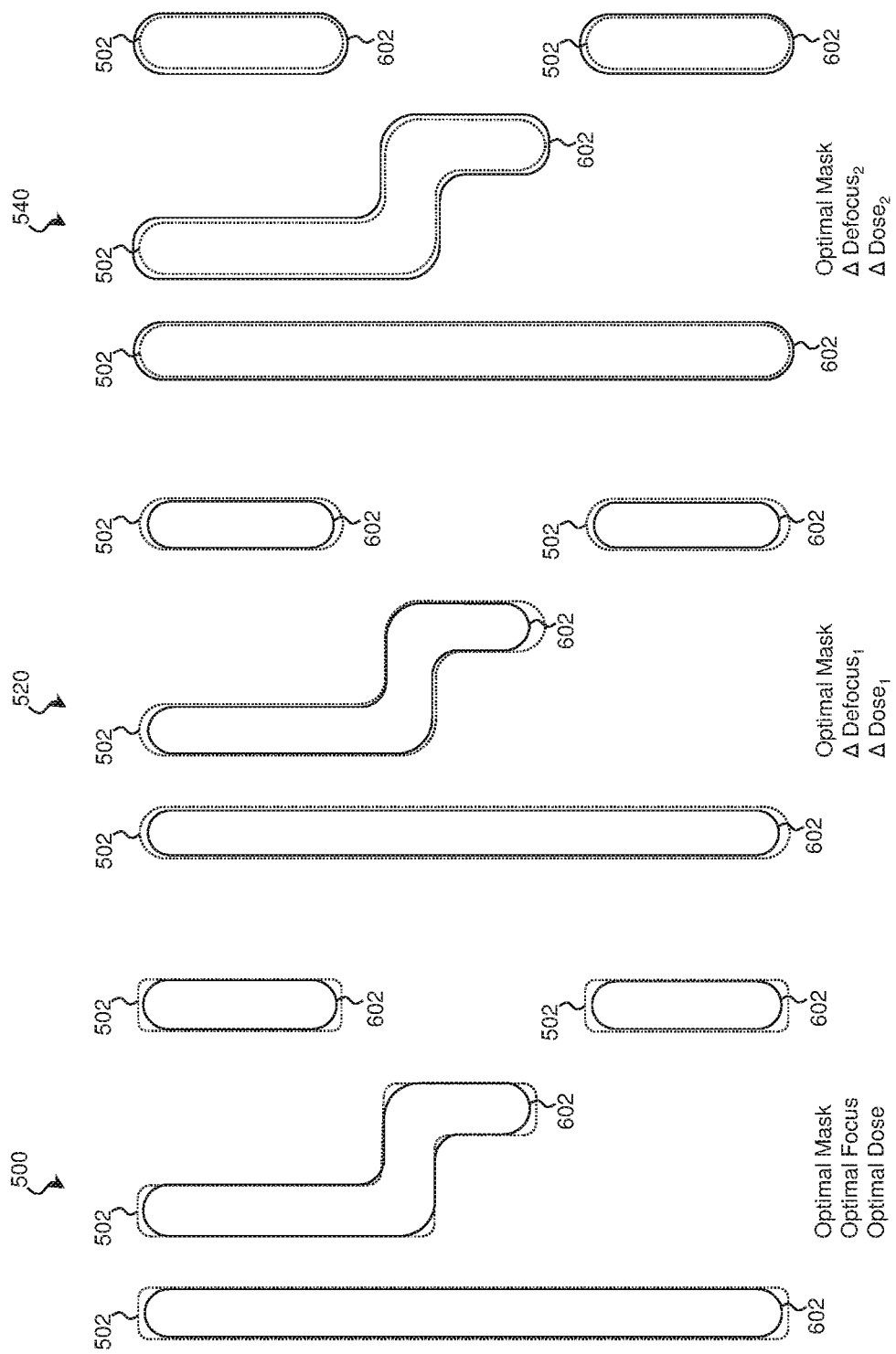

OPTICAL PROXIMITY CORRECTION AND PHOTOMASKS

PRIORITY DATA

The present application is a continuation of U.S. patent application Ser. No. 17/665,757, filed Feb. 7, 2022, which is a continuation of U.S. patent application Ser. No. 16/895,547 filed Jun. 8, 2020, now issued U.S. Pat. No. 11,243,472, which is a continuation of U.S. patent application Ser. No. 16/057,277 filed Aug. 7, 2018, now issued U.S. Pat. No. 10,678,142, which claims the benefit of U.S. Provisional Application No. 62/585,914, entitled "Optical Proximity Correction and Photomasks," filed Nov. 14, 2017, herein incorporated by reference in their entireties.

BACKGROUND

The semiconductor Integrated Circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, some advances compensate for optical effects and processing imperfections that occur near the limits of lithography. In many examples, ICs features are defined and formed on a semiconductor substrate using a set of photolithographic masks. The masks have patterns formed by transmissive and/or reflective regions. During a photolithographic exposure, radiation such as ultraviolet light passes through or reflects off the mask before striking a photoresist coating on the substrate. The mask transfers the pattern onto the photoresist, which is then selectively removed to reveal the pattern. The substrate then undergoes processing steps that take advantage of the shape of the remaining photoresist to create circuit features on the substrate. When the processing steps are complete, another photoresist is applied and substrate is exposed using the next mask. In this way, the features are layered to produce the final circuit.

However, the patterns formed on the substrate may vary from the patterns of the mask. For example, optical effects including diffraction, fringing, and interference may affect where radiation falls on the workpiece. Likewise, properties of the masks, the lithographic system, and/or the workpiece may determine which portions of the photoresist are exposed. Variability in processing steps such as photoresist developing, etching, deposition, implantation, etc. may also affect the shape of the final pattern. If not accounted for, these effects may cause variances such as corner rounding, edge errors, necking, bridging, and incomplete features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a diagram of a portion of a layout for fabricating an integrated circuit undergoing a method of fabrication according to various embodiments of the present disclosure.

FIG. 4 is a plot of process conditions within a process window according to various embodiments of the present disclosure.

FIGS. 5A-7C are diagrams of simulation environments during the course of a method according to various embodiments of the present disclosure.

DETAILED DESCRIPTION

Figure 1:
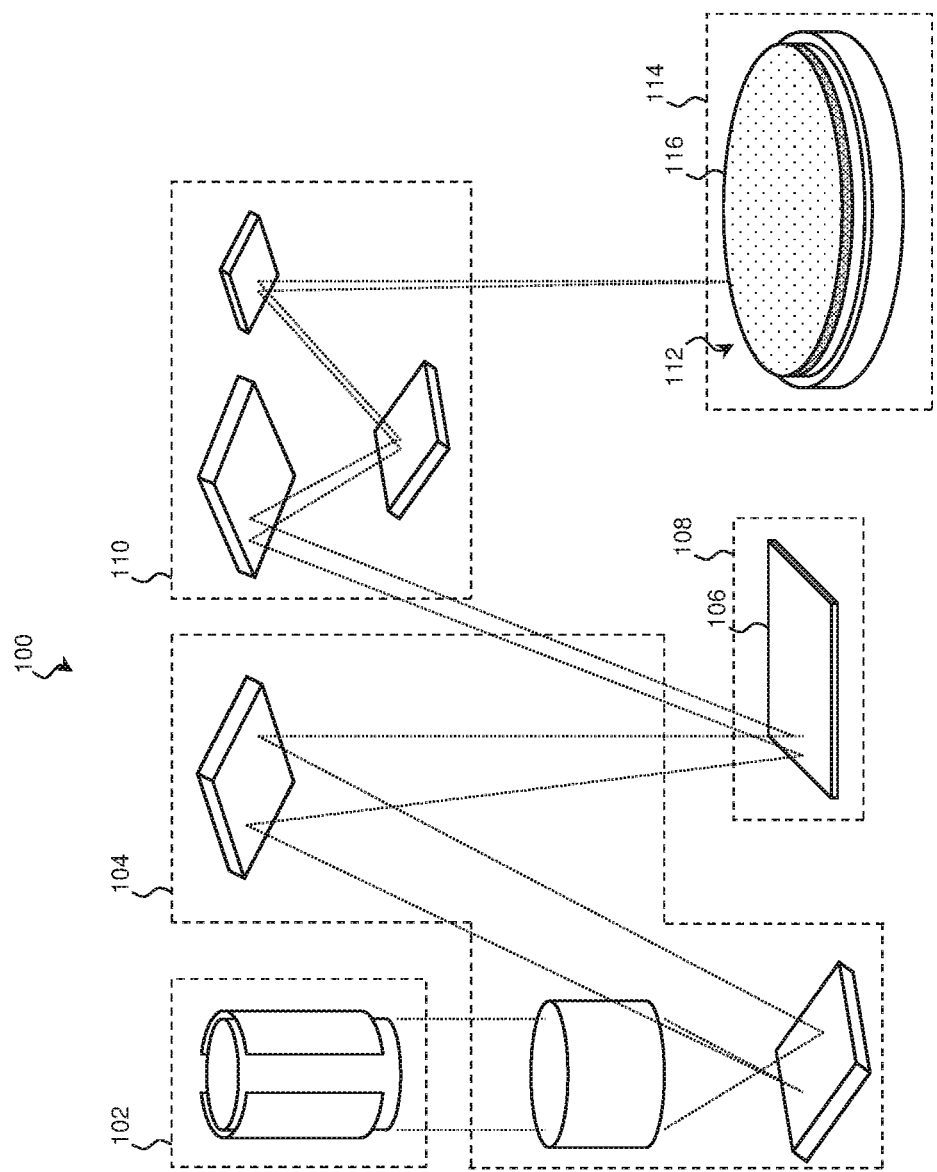
FIG. 1 is a block diagram of a lithography system according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As feature sizes shrink, differences between mask features and the features formed on a workpiece impart a larger effect on device performance. In an example of a simple line, a variety of effects may tend to round the line ends rather than produce a crisp corner and may tend to produce a line of irregular width. These effects may come from the illumination source, the mask, the lithography system, the fabrication process (e.g., developing, etching, depositing, etc.), and/or other sources. Of course, these are only some examples of feature discrepancies that occur in integrated circuit formation and their causes. Other thickness variations, placement variations, and irregularities may occur alone or in combination. The impact of these variations may be exacerbated as the size of a feature shrinks because the variations remain the same or become larger, and thus the imperfection grows relative to the feature.

To compensate for this, many examples of the present disclosure receive a layout specifying shapes to be formed on a mask and, in turn, on a workpiece. The layout shapes are modified using a variety of correction processes so that when a mask is formed based on the layout, the features on the workpiece print as intended. In some such examples, this includes simulating a photolithographic process using the shapes in the layout and potential modifications to the layout and/or lithography system to determine the resulting features on the workpiece. The simulated results may be compared to a lithographic target, and each potential modification may be evaluated by how close the resulting feature is to the target. Modifications may be selected based on their results and applied to the layout.

Because the process conditions may unavoidably vary across a workpiece and between workpieces, simulation may be performed at more than one set of process conditions. In some such examples, this is done by selecting specific lithographic targets for specific sets of processing conditions. Specifically, some targets may be determined based on simulation results at other process conditions. The simulated targets may be configured to optimize the modifications for uniformity across process conditions rather than conformity to an ideal feature. In this way and others, some embodiments reduce variability across conditions, improve contrast, improve feature fidelity, and provide other advantages to the lithographic process. However, it is understood that no particular advantage is required for any particular embodiment.

As described below, the present disclosure provides a technique for modifying a mask pattern to compensate for lithographic effects and other fabrication variations in order to increase uniformity of the final features. Examples of a system for exposing a workpiece according to the mask and examples of effects that may affect the final features are described with reference to FIG. 1. In that regard, FIG. 1 is a block diagram of a lithography system 100 according to various embodiments of the present disclosure. The lithography system 100, which may also be referred to as a scanner, is operable to perform a lithographic exposure process utilizing a characteristic radiation source and exposure mode. In the illustrated embodiments, the lithography system 100 is an extreme ultraviolet (EUV) lithography system designed to expose a workpiece using EUV radiation having a wavelength ranging between about 1 nm and about 100 nm. In some exemplary embodiments, the lithography system 100 includes a radiation source 102 that generates EUV radiation with a wavelength centered at about 13.5 nm. In one such embodiment, an EUV radiation source 102 utilizes laser-produced plasma (LPP) to generate the EUV radiation by heating a medium such as droplets of tin into a high-temperature plasma using a laser.

The lithography system 100 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or minor arrays. The number of optical components shown FIG. 1 have been reduced for clarity, and in actual embodiments, the illuminator 104 includes dozens or even hundreds of lenses and/or mirrors. The optical components are arranged and aligned to project radiation emitted by the radiation source 102 onto a mask 106 retained in a mask stage 108. An exemplary mask 106 will be described in further detail in subsequent figures. The optical components of the illuminator 104 may also shape the radiation along the light path in order to produce a particular illumination pattern upon the mask 106.

After passing through or reflecting off the mask 106, the radiation is directed through a projection optics module 110, also referred to as a Projection Optics Box (POB). Similar to the illuminator 104, the projection optics module 110 may include refractive optical components, including monolithic lenses and/or array lenses (e.g., zone plates), and may include reflective optical components, including monolithic mirrors and/or minor arrays. The optical components of the projection optics module 110 are arranged and aligned to direct radiation transmitted through or reflecting off the mask 106 and to project it onto a workpiece 112, such as the illustrated semiconductor substrate or any other suitable workpiece, retained in a substrate stage 114. In addition to guiding the radiation, the optical components of the projection optics module 110 may also enlarge, narrow, focus, and/or otherwise shape the radiation along the light path.

Radiation projected by the projection optics module 110 on the workpiece 112 causes changes in a photosensitive component of the target. In an example, the workpiece 112 includes a semiconductor substrate with a photoresist 116. Portions of the photoresist 116 that are exposed to the radiation undergo a chemical transition making them either more or less sensitive to a developing process. In an exemplary embodiment, after the exposure, the photoresist 116 undergoes a post-exposure baking, developing, rinsing, and drying in order to complete the transition. Subsequent processing steps performed on the workpiece 112 may use the pattern of the remaining photoresist 116 to selectively process portions of the workpiece 112.

As noted above, a number of effects may cause the pattern formed in the photoresist 116 to differ from the intended pattern. These may include optical effects such as diffraction, fringing, and interference. Differences in the pattern may also be caused by aspects of the system 100. For example, the illumination provided by the system 100 may vary across a workpiece 112 or between workpieces 112. In other words, even with defect-free optics and masks, the complexities of the beam paths and other optical effects within the system 100 may cause the dose (i.e., the exposure intensity) to vary across the surface of a given workpiece 112 and may cause the dose to vary from workpiece to workpiece. Similarly, the focus of the projected features may vary across a workpiece 112 and between workpieces due to the beam path, the quality of the optics, variations in the workpiece 112, irregularities the photoresist 116 surface, and/or other factors. Accordingly, in the examples that follow, the mask 106 features are configured to compensate for optical effects and process conditions such as dose variations, focus variations, manufacturing imperfections including mask error, and/or other conditions that impact the features formed in the photoresist 116.

Figure 2A:
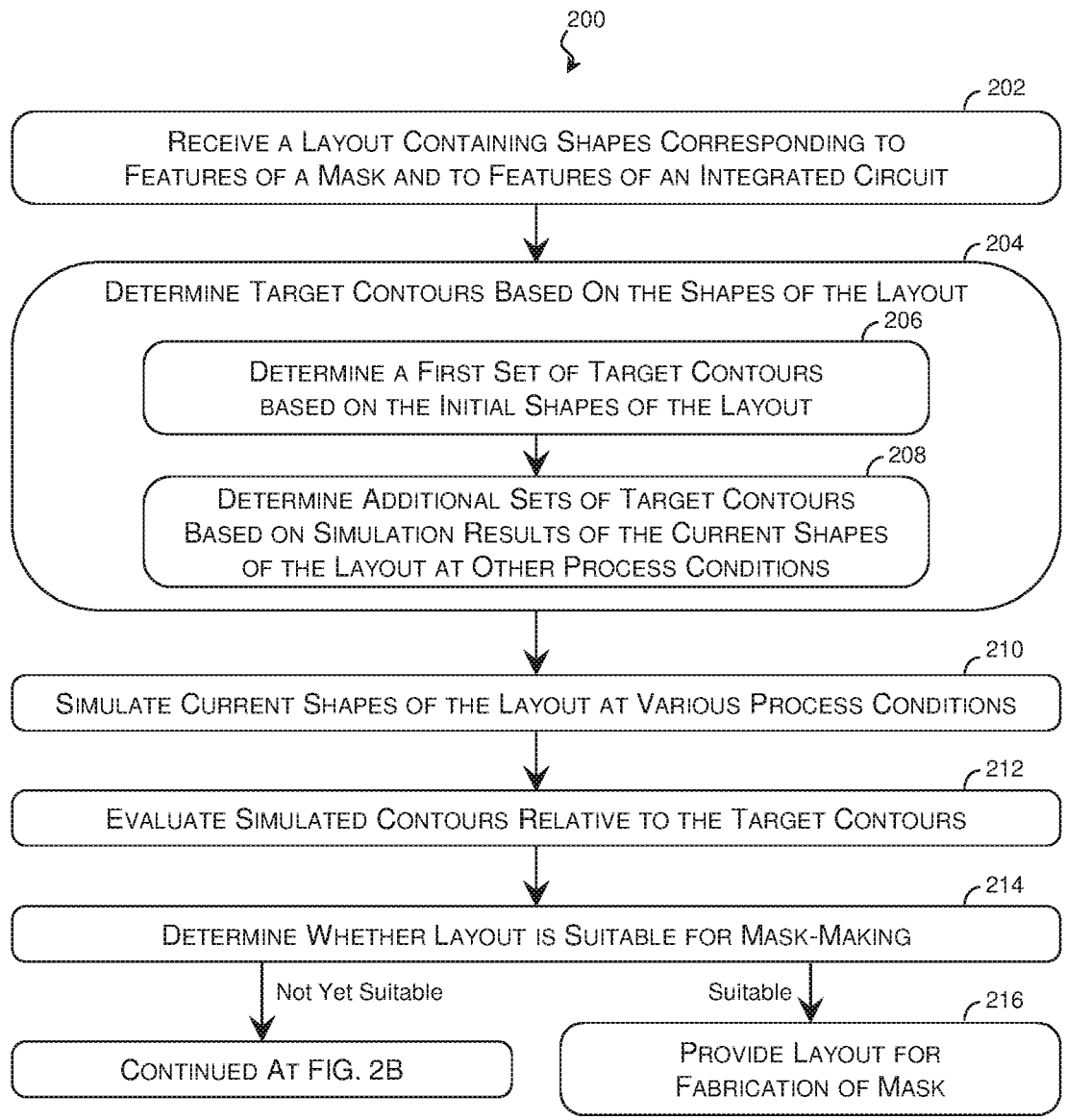
FIGS. 2A and 2B are flow diagrams of a method of defining a mask for fabricating an integrated circuit according to various embodiments of the present disclosure.
Figure 2B:
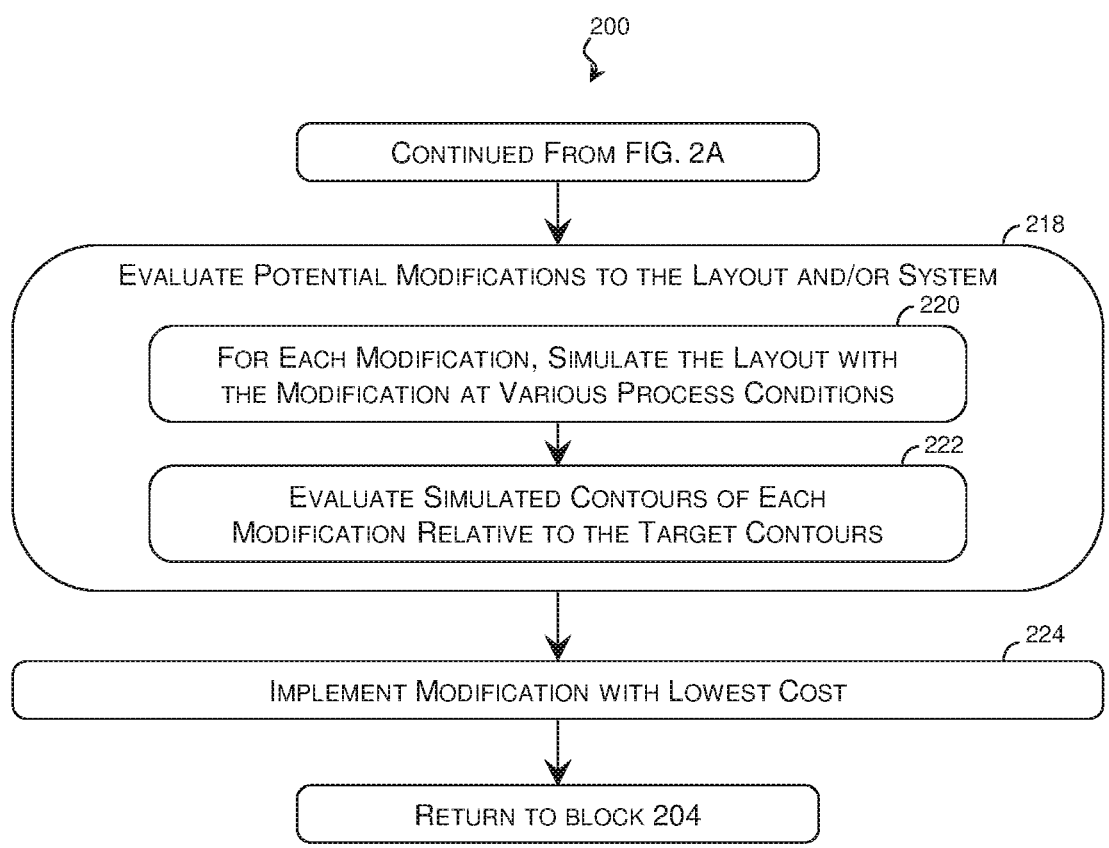
Figures 5A, 5B, 5C:
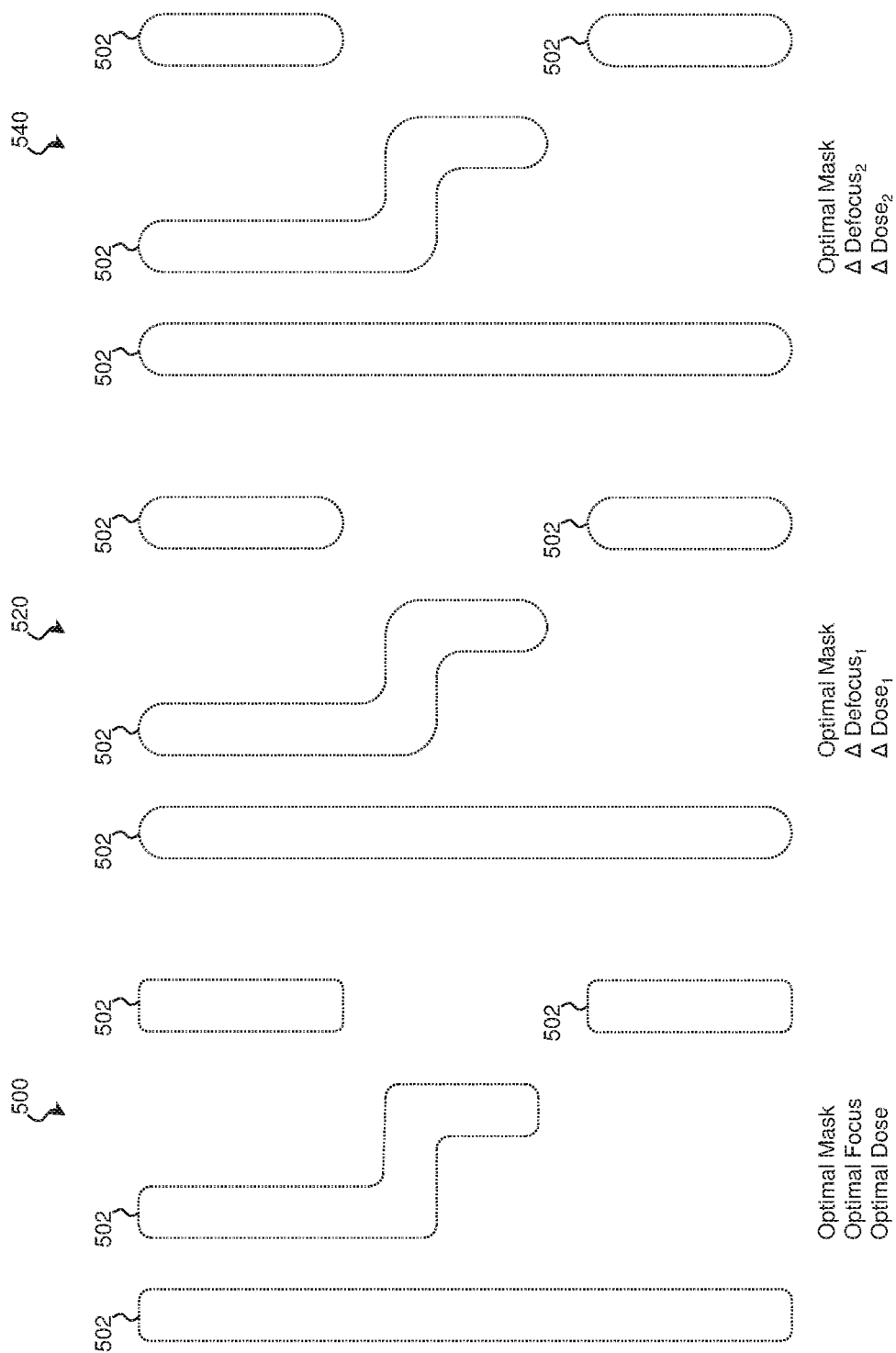
Figure 7C:
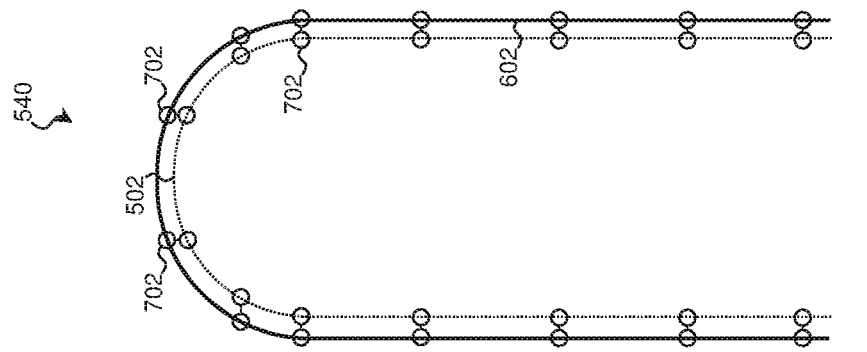
Figure 7B:
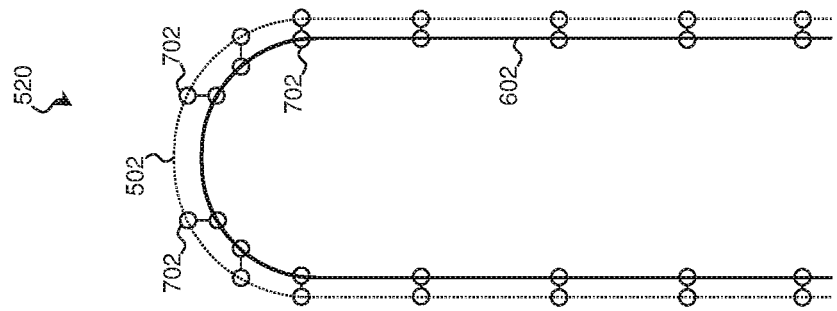
Figure 7A:
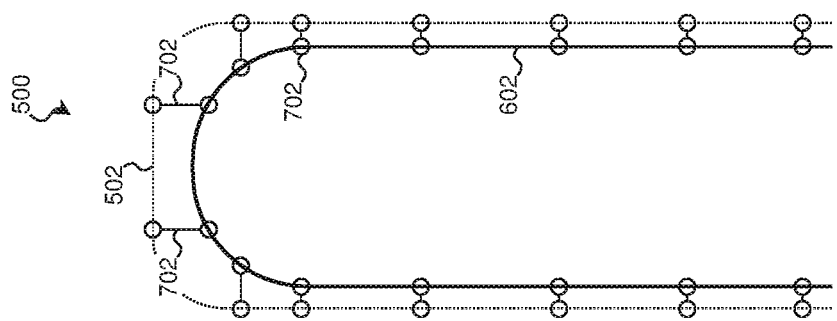

A technique for fabricating a photolithographic mask is described with reference to FIGS. 2A, 2B, and 3-7C. In that regard, FIGS. 2A and 2B are flow diagrams of a method 200 of defining a mask for fabricating an integrated circuit according to various embodiments of the present disclosure. Additional steps can be provided before, during, and after the method 200, and some of the steps described can be replaced or eliminated for other embodiments of the method 200. FIG. 3 is a diagram of a portion of a layout 300 for fabricating an integrated circuit undergoing the method 200 according to various embodiments of the present disclosure. FIG. 4 is a plot 400 of process conditions within a process window according to various embodiments of the present disclosure. FIGS. 5A-7C are diagrams of simulation environments during the course of the method 200 according to various embodiments of the present disclosure. Specifically, FIGS. 6A, and 7A are diagrams of a first simulation environment 500, FIGS. 5B, 6B, and 7B are diagrams of a second simulation environment 520, and FIGS. 5C, 6C, and 7C are diagrams of a third simulation environment 540.

Referring first to block 202 of FIG. 2A and to FIG. 3, the layout 300 is received for fabrication of the mask 106. In various examples, the layout 300 takes the form of a data file stored on a non-transitory computer-readable medium and is represented in a design standard such as GDSII, OASIS, and/or MEBES®, a registered trademark of Applied Materials. The layout 300 may be a digital representation of an integrated circuit, and shapes 302 of the layout 300 may correspond to and define physical features of masks and, by extension, features of an integrated circuit to be formed by the masks. As a layout 300 may include millions of shapes 302 or more, the layout 300 of FIG. 3 has been simplified to show a subset of the shapes 302 for clarity. In various embodiments, the shapes 302 of the layout 300 correspond to features (e.g., doped wells, doped active regions, device gates, contacts, interconnect lines, interconnect vias, etc.) of an integrated circuit workpiece 112, and in some examples, when the layout 300 is received, the shapes 302 correspond to idealized versions of the integrated circuit features to be formed on a workpiece 112.

To compensate for a variety of optical and fabrication effects, the method 200 may alter the existing shapes 302 and may add additional shapes 302 to the layout 300 such that when a mask 106 is formed based on the layout 300, the resulting integrated circuit features correspond closely to the idealized versions. The process of modifying the layout 300 to compensate for these effects may be referred to as Optical Proximity Correction (OPC). OPC includes model-based compensations where pattern matching is used to determine a corrected shape and simulation-based compensations where a lithographic process is simulated and the shapes are modified based on the results of the simulation. In an example of the latter, a number of simulations may be performed on the shapes 302 of the layout 300 with or without potential OPC modifications to simulate lithographic processes. The simulation results may be compared to a set of targets, and the differences (e.g., Edge Placement Error (EPE)) may be used to determine which potential modification to incorporate into the layout 300. To improve consistency across a workpiece 112 and between workpieces, simulation may be performed at optimal process conditions as well as a variety of less-than-optimal conditions within a process window.

Various process conditions are shown in the context of FIG. 4. In that regard, FIG. 4 shows a 3-axis plot 400 of process conditions, with each axis representing values (conditions) of a process parameter. In an example, a first axis 402 represents a mask error (e.g., a variation between where a mask feature is intended and where the mask feature is formed, a variation between intended reflectivity/transmissivity/phase-shift of the mask feature and the actual reflectivity/transmissivity/phase-shift, etc.). In the example, a second axis 404 represents a focus variation (i.e., defocus) where the radiation strikes the photoresist 116. In the example, a third axis 406 represents a dose variation where the radiation strikes the photoresist 116. Of course, these process parameters are merely exemplary, and other examples use any number of axes and likewise consider any number of process parameters. For example, in various embodiments, an axis represents film stack sensitivity, aberration sensitivity, developer variability, etching variability, and/or other suitable parameters. Likewise, a parameter such as defocus may be broken down into multiple axes according the source of the defocus.

Simulation may be performed at a number of process conditions within a process window 408, a set of expected values for the process parameters. For example, marker 410A represents a lithographic simulation using an optimal value for mask error, defocus, and dose. Marker 410B represents a lithographic simulation using an optimal value for mask error with defocus and dose values that differ from the optimal. Similarly, marker 410C represents a lithographic simulation using an optimal value for mask error with defocus and dose values that differ from the optimal. Other exemplary process conditions for simulation are represented by markers 410, and it is noted that simulation may be performed at boundaries of the process window 408 (e.g., edges and/or corners) as well as non-boundary conditions. The simulation results at these process conditions may be compared to targets and used to modify the layout.

Referring to block 204 of FIG. 2A and to FIGS. 5A-5C, a set of target contours 502 are determined based on the shapes 302 of the layout. The target contours 502 may represent exposed or unexposed regions of a photoresist 116. As explained above, a photoresist 116 may include a photosensitive material that causes the photoresist 116 to undergo a property change when exposed to dose of light exceeding a particular threshold. The property change may make the photoresist 116 more or less sensitive to a developer. In this way, the property change may be used to selectively remove exposed or unexposed portions of the photoresist layer. The target contours 502 may represent the boundary between those regions that meet or exceed the threshold dose and those regions that do not. Additionally or in the alternative, the target contours 502 may represent boundaries of features formed on a workpiece 112 using a patterned photomask and accounting for effects of processing on the feature boundaries. As simulation may be performed at more than one set of process conditions, in some examples, more than one set of target contour 502 may be determined, and each target contour may be instantiated in a simulation environment (e.g., simulation environment 500, simulation environment 520, simulation environment 540, etc.) corresponding to a specific set of process conditions.

Accordingly, referring to block 206 of FIG. 2A and to FIG. 5A, determining the set of target contours 502 may include determining a first set of target contours 502 for a simulation environment 500 that simulates optimal process conditions. The first set of target contours 502 may correspond to the shapes 302 at the time the layout 300 is received. However, to avoid aggressively chasing an ideal result, the first set of target contours 502 may include some real-world effects that have been determined to be yield-safe such as a certain degree of corner rounding and/or thickness variations.

Referring to block 208 of FIG. 2A and to FIGS. 5B and 5C, determining the set of target contours 502 may include determining sets of target contours 502 for simulation environments (e.g., simulation environment 520, simulation environment 540, etc.) that simulate process conditions that vary from the optimal. For example, a second set of target contours 502 may be used in a simulation environment 520 that models a first amount of defocus (Δ defocus 1) and a first amount of dose variation (Δ dose$_1$), and a third set of target contours 502 may be used in a simulation environment 540 that models a second amount of defocus (Δ defocus$_2$) and a second amount of dose variation (Δ dose$_2$). Similar to the first set of target contours 502, these target contours 502 may be based in part on the shapes 302 in the layout 300 when it is received including some real-world effects such as a degree of corner rounding and thickness variations.

Furthermore, it is been determined that by careful selection of the target contours, greater uniformity across the process window may be achieved. Accordingly in some examples, the target contours 502 in the second and third simulation environments are based on simulating shapes in the layout 300 (as they currently exist including any previously determined modifications) at different process conditions. In an example where the second simulation environment 520 models non-optimal conditions in more than one process parameter (e.g., Δ defocus$_1$ and Δ dose$_1$), the target contours 502 in the second simulation environment 520 are determined from a simulation of the shapes 302 as they currently exist in the layout 300 where at least one of the non-optimal conditions is set to an optimal value (e.g., simulation at Δ defocus with optimal dose or at optimal defocus with Δ dose$_1$). As will be explained more below, this has the effect of optimizing the layout 300 to reduce the variations in the non-optimal parameter. In this example, the third simulation environment 540 models non-optimal conditions of Δ defocus$_2$ and Δ dose$_2$, and the third set of target contours 502 is determined from a simulation of the shapes 302 as they currently exist in the layout 300 where at least one of the non-optimal conditions is set to an optimal value (e.g., Δ defocus$_2$ with optimal dose, or optimal defocus with Δ dose$_2$).

In some examples, the target contours are determined by averaging more than one set of process conditions being evaluated. In some such examples, the second set of target contours 502 and the third set of target contours 502 are to be used in simulations where some process conditions are in common. In one such example, the mask error is the same (optimal mask error), the dose is the same (Δ dose$_1$=Δ dose$_2$), and the defocus amounts vary. Accordingly, one or more of the process condition(s) that vary between the simulations may be averaged to determine the target contours. In other words, the second set of target contours 502 and the third set of target contours 502 may be determined from a simulation of the shapes 302 as they currently exist in the layout 300 at the conditions: optimal mask error, Δ dose$_1$ (which substantially equals Δ dose$_2$), and a defocus that is the average of Δ defocus$_1$ and Δ defocus$_2$. This has the effect of optimizing the layout 300 to reduce the variations in the parameter being averaged.

Referring to block 210 of FIG. 2A and to FIGS. 6A-6C, simulation(s) are performed to simulate a lithographic process of the shapes 302 as they currently exist in the layout 300 at the various process conditions. In the example of FIG. 6A, this may include a lithographic simulation of the layout 300 at an optimal amount of mask error, focus, and dose. This produces a first set of simulated contours 602, which may represent a boundary between exposed and unexposed regions of a photoresist 116 and specifically the boundary of those photoresist 116 regions that meet or exceed the threshold dose and those regions that do not. In some examples, the first set of simulated contours 602 represents boundaries of features formed on the workpiece 112. In the example of FIG. 6B, this may include a lithographic simulation of the layout 300 at an optimal amount of mask error and at Δ dose$_1$ and Δ defocus$_1$. This produces a second set of simulated contours 602, which may represent boundaries between exposed and unexposed regions of a photoresist 116 and/or boundaries of features formed on the workpiece 112. In the example of FIG. 6C, this may include a lithographic simulation of the layout 300 at an optimal amount of mask error and at Δ dose$_2$ and Δ defocus$_2$. This produces a third set of simulated contours 602, which may represent boundaries between exposed and unexposed regions of a photoresist 116 and/or boundaries of features formed on the workpiece 112. Of course, simulation may be performed at any number of sets of process conditions.

Referring to block 212 of FIG. 2A and to FIGS. 7A-7C, the simulated contours 602 are evaluated relative to the target contours 502. In some examples, this includes determining edge placement errors 702 based on the difference between an edge of a target contour 502 and an edge of a simulated contour 602. Any number of edge placement errors 702 may be determined for each shape 302 in the layout, and each edge placement error 702 may correspond to a particular segment of the respective shape 302. Likewise, each set of target contours and simulated contours may have corresponding edge placement errors 702, and corresponding edge placement errors 702 may be compared across simulations and process conditions.

Evaluating the simulated contours 602 in block 212 may also include other evaluations such as calculating an Image Log Slope (ILS) and/or Normalized Image Log Slope (NILS) for the contours. ILS and NILS are measures of how abruptly light changes intensity. For this reason, ILS and NILS may be used as contrast checks. Sharply defined transitions from dark to light provide a precise exposure and well-defined features. A poorly defined transition may prevent a mask feature from printing entirely. Accordingly, contrast checks including ILS- and NILS-based checks may be used to evaluate the simulated contours 602 in block 212.

Referring to block 214 of FIG. 2A, it is determined whether the layout 300 is suitable to fabricate a mask. This determination may depend, in part, on whether the edge placement errors 702 are suitably small (e.g., less than a threshold). The determination may also consider whether the layout 300 meets various design rules such as a Mask Rule Check (MRC), Design Rule Check (DRC), Electrical Rule Check (ERC), and/or other suitable design rules. In some such examples, the determination in block 214 includes a contrast check such as an ILS- and/or NILS-based check to determine whether a layout 300 is suitable for use in mask-making.

In some examples, the determination of block 214 considers a mask performance metric such as a Mask Error Enhancement Factor (MEEF). MEEF is a measure of how variations in size of a mask feature affect the corresponding workpiece feature. MEEF accounts for magnification in the optical path and for non-linear optical relationships during between the mask 106 and the workpiece 112. Accordingly, MEEF and/or other mask performance metrics may be used to determine whether a layout is suitable. If the layout 300 is determined to be suitable in block 214, the layout 300 may be provided for mask fabrication in block 216.

If it is determined that the mask is not yet suitable for fabrication (e.g., the edge placement errors 702 are not less than the threshold), in block 218 of FIG. 2B, a set of potential modifications to the layout 300 and/or lithography system are evaluated based on metrics such as the edge placement errors 702. In some examples, modifications include expanding or contracting portions of a shape 302, particularly at shape corners, in order to reduce the edge placement errors 702. This may have the effect of creating hammerheads and/or serifs at corners of a shape 302. Furthermore, because closely spaced mask features may constructively interfere to produce a more focused dose of radiation on the workpiece, in some examples, a set of modifications includes adding non-printing assist features or scatter bars to the layout 300 in order to reduce the edge placement errors 702 of the adjacent printing shapes 302. Modifications may also include changes to the setup of the lithography system 100, such as a change in the illuminator 104, radiation source 102, projection optics module 110, etc.

Referring to block 220 of FIG. 2B, a lithographic simulation is performed on each potential modification. This may be performed substantially as described in block 210 of FIG. 2A. The simulation of block 220 may simulate a lithographic exposure and fabrication of a workpiece using the layout including the potential modification at any number of different process conditions. In an example, this includes a first simulation at an optimal amount of mask error, focus, and dose to produce a first set of simulated contours 602, a second simulation at an optimal amount of mask error and at $\Delta$ dose$_1$ and $\Delta$ defocus$_1$ to produce a second set of simulated contours 602, and a third simulation at an optimal amount of mask error and at $\Delta$ dose$_2$ and $\Delta$ defocus$_2$ to produce a third set of simulated contours 602. Of course, simulation may be performed at any number of different process conditions.

Referring to block 222 of FIG. 2B, the simulated contours 602 of each potential modification are evaluated relative to the target contours 502. This may be performed substantially as described in block 212 of FIG. 2A, and the target contours 502 may be the same contours described above. In some examples, evaluation includes determining edge placement errors 702 based on the difference between an edge of a target contour 502 and an edge of a simulated contour 602. Any number of edge placement errors 702 may be determined for each shape 302 in the layout, and each edge placement error 702 may correspond to a particular segment of the respective shape 302. Likewise, each set of target contours and simulated contours may have corresponding edge placement errors 702, and corresponding edge placement errors 702 may be compared across simulations and process conditions. Evaluating the simulated contours 602 in block 222 may also involve other evaluations including contrast checks such as ILS- and NILS-based checks, and/or mask checks such as MEEF.

The evaluation may determine which of the potential modifications improves the overall quality of the resulting mask by reducing edge placement errors 702, improving contrast, and/or improving other mask metrics. It is noted that modifications to the layout 300 to improve mask quality at one set of process conditions may adversely impact the mask quality at another set of process conditions. Accordingly in some examples, the modifications are evaluated in block 222 using a multivariate solution technique such as cost minimization. In some such examples, a cost function is defined that accounts for the edge placement errors 702 and/or other metrics at the different process conditions, and an iterative cost minimization technique is used to determine modifications that minimize the cost.

In some such examples, the cost function structured as a sum of squares:

$$\text{Cost} = \Sigma \text{EPE}^2$$

where Cost represents a final cost of a particular modification to the layout 300, and EPE represents an edge placement error at the particular set of process conditions. In further examples, the edge placement errors are individually weighted and additional factors are considered using a cost function such as:

$$\text{Cost} = \Sigma \omega |\text{EPE}|^n + \Sigma \text{Penalties}$$

where Cost represents the final cost of the set of modifications to the layout 300, EPE represents an edge placement error at the particular set of process conditions, w represents a weighting factor for the particular edge placement error, n represents a polynomial weighting value, and Penalties represent numerical penalties associated with the set of modifications. The Penalties terms may be used to weight against modifications that may violate a design rule (e.g., MRC, DRC, ERC, etc.); may not meet a performance index (e.g., ILS, NILS, Depth of Focus (DoF), etc.); may not meet a mask rule (e.g., MEEF); adversely impact mask-making, lithography, and/or fabrication; and/or produce other adverse conditions.

The potential modifications to the layout 300 (e.g., moving a boundary of a shape 302, adding/moving/removing a non-printing feature, etc.) and/or lithography system 100 are evaluated using the cost function and a modification that produce the lowest cost may be implemented in the layout 300 in a subsequent block. If the lowest cost modification exceeds a maximum cost threshold, an alert may be triggered.

It has been determined that, for some shapes 302 and layouts 300, solutions that compare the simulated contours 602 for all process conditions to a single target contour 502 (e.g., the ideal feature shapes with or without some corner rounding) tend to overvalue correcting the edge placement error at the most extreme conditions. This has the effect of increasing variability in the features formed when the process conditions vary from the optimal. Using simulated target contours tailored to the particular process conditions may remedy this. Accordingly, many of the present embodiments utilize different target contours for the different process conditions and in so doing, the solution technique may minimize the variance in the features formed on the workpiece 112 across the process conditions. In particular, by using simulation results to generate the target contours for the non-optimal process conditions, the solution technique may focus on minimizing variability and improving contrast rather than aggressively attempting to make the results at non-optimal process conditions closer to the ideal. Accordingly, it can be seen that the present technique provides improvements in mask making and in the function (e.g., uniformity, reproducibility, etc.) of the lithography system 100 in which the mask is used.

Referring to block 224 of FIG. 2B, the set of modifications with the lowest cost determined in block 222 are implemented in the layout 300 and/or system 100, and the process returns to block 204. This may continue until the method 200 determines that a corresponding mask fabricated using the layout 300 is suitable for lithographically exposing the workpiece 112 in block 214.

Figure 8:
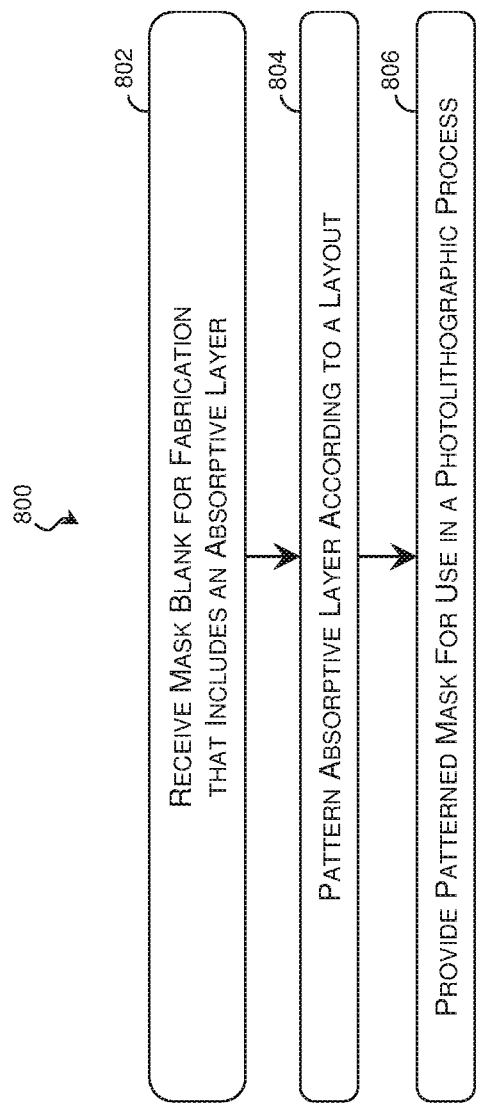
FIG. 8 is a flow diagram of a method of fabricating a photolithographic mask according to various embodiments of the present disclosure.
Figure 9:
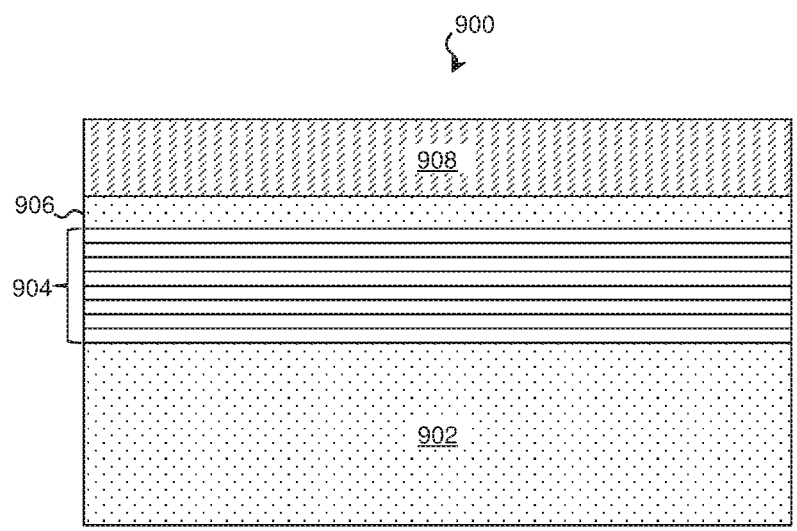
FIGS. 9 and 10 are cross-sectional views of a portion of a mask being fabricated according to various embodiments of the present disclosure.
Figure 10:
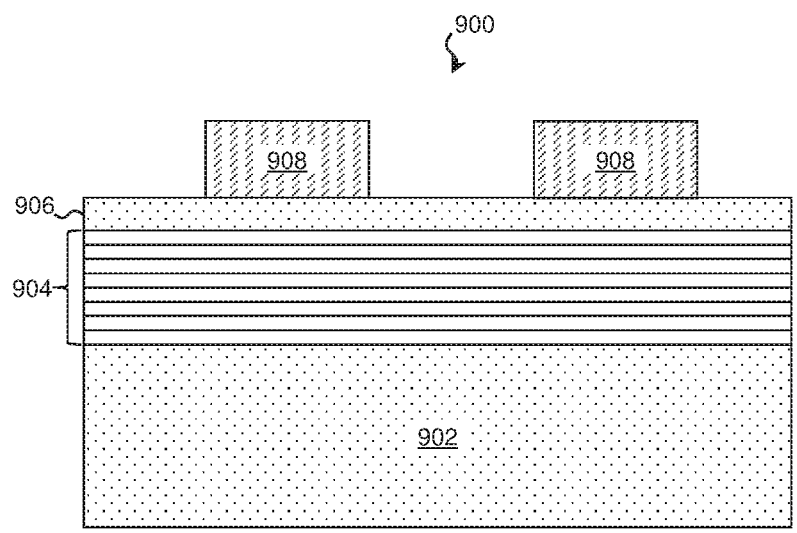

In this way, the method 200 provides a layout 300 for fabricating a photolithographic mask. An example of mask fabrication is described with reference to FIGS. 8-11. In that regard, FIG. 8 is a flow diagram of a method 800 of fabricating a photolithographic mask according to various embodiments of the present disclosure. Additional steps can be provided before, during, and after the method 800, and some of the steps described can be replaced or eliminated for other embodiments of the method 800. FIGS. 9 and 10 are cross-sectional views of a portion of a mask 900 being fabricated according to various embodiments of the present disclosure. FIG. 10 is a top view of a portion of the mask 900 being fabricated according to various embodiments of the present disclosure. As a mask may contain millions of mask features (or more), only a small subset of the features is shown for clarity. The finished mask 900 may be substantially similar to mask 106 of FIG. 1 and is suitable for use with the illustrated lithography system 100.

Referring to block 802 of FIG. 8 and to FIG. 9, the mask 900 for fabrication is received. As the mask 900 is not yet patterned, it may be referred to as a mask blank. The mask 900 of FIG. 9 is representative of a reflective mask, although the principles the present disclosure apply equally to a transmissive mask.

The mask 900 includes various layers formed on a mask substrate 902. The mask substrate 902 may include a Low Thermal Expansion Material (LTEM) such as quartz, LTEM glass, silicon, silicon carbide, silicon oxide, titanium oxide, Black Diamond® (a trademark of Applied Materials), and/or other suitable mask substrate. The mask 900 may include a reflective structure 904, such as a MultiLayer Minor (MLM), disposed on the mask substrate 902. An MLM may include a number of alternating material layers tailored in thickness and/or material to achieve optimal constructive interference of the radiation reflected at each material interface while reducing light absorption. In an exemplary embodiment, an MLM includes 40 pairs of alternating molybdenum and silicon (Mo—Si) layers. In further exemplary embodiments, an MLM includes between 20 and 80 pairs of alternating molybdenum and beryllium (Mo—Be) layers. Radiation that reaches the reflective structure 904 is reflected back for use in exposing a photoresist 116 of a workpiece 112. A capping layer 906 (also known as a buffer layer) may be disposed over the reflective structure 904, and may include a material such as Ru, silicon dioxide, amorphous carbon, and/or other suitable material.

The mask 900 includes an absorptive layer 908 disposed on the capping layer 906. As the name implies, the absorptive layer 908 absorbs radiation and prevents it from exposing the workpiece 112. Suitable materials for use in the absorptive layer 908 include TaN, TaBN, TiN, chromium, combinations thereof, and/or other suitable absorptive materials. In some embodiments, the absorptive layer 908 contains multiple layers of absorptive material, for example, a layer of chromium and a layer of tantalum nitride. The absorptive layer 908 may also include an anti-reflective coating (ARC), and suitable ARC materials include TaBO, $Cr_2O_3$, $SiO_2$, SiN, $TaO_5$, TaON, and/or other suitable materials.

Figure 11:
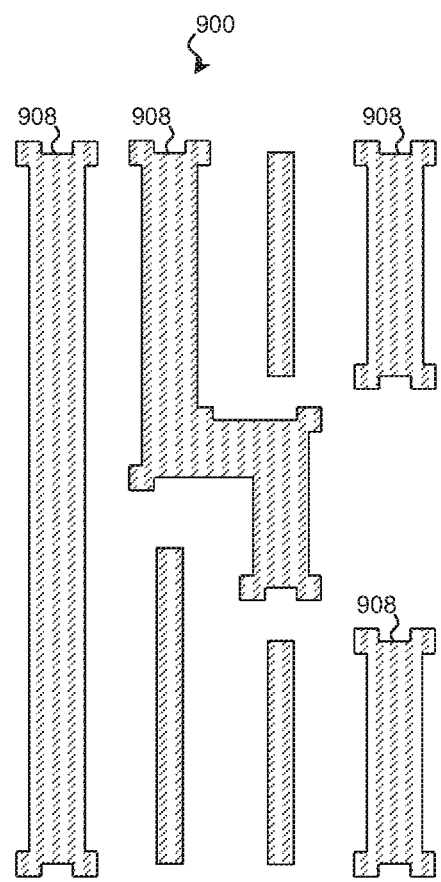
FIG. 11 is a top view of a portion of a mask being fabricated according to various embodiments of the present disclosure.

Referring to block 804 of FIG. 8 and to FIGS. 10 and 11, the absorptive layer 908 of the mask is patterned based on a layout such as the layout 300 described above. In some examples, the absorptive layer 908 is patterned using a direct-write process where a laser, electron-beam (e-beam), ion beam, or other narrow-focused emission weakens and/or removes portions of the absorptive layer 908.

In some examples, a resist, similar to photoresist 116 above, that is sensitive to a direct-write emission (e.g., a laser-sensitive resist, and electron-beam-sensitive resist, an ion-beam-sensitive resist, etc.) is formed on the absorptive layer and exposed using a direct-write tool. The resist is then developed to selectively remove either the unexposed or the exposed portions and thereby expose portions of the absorptive layer 908 to be removed. An etching technique (e.g., dry etching, wet etching, Reactive Ion Etching (RIE), etc.) may be performed to remove the exposed portions of the absorptive layer 908.

Referring to block 806 of FIG. 8, the patterned mask 900 is provided for use in a photolithographic process for fabricating an integrated circuit or other suitable photolithographic process.

Figure 12:
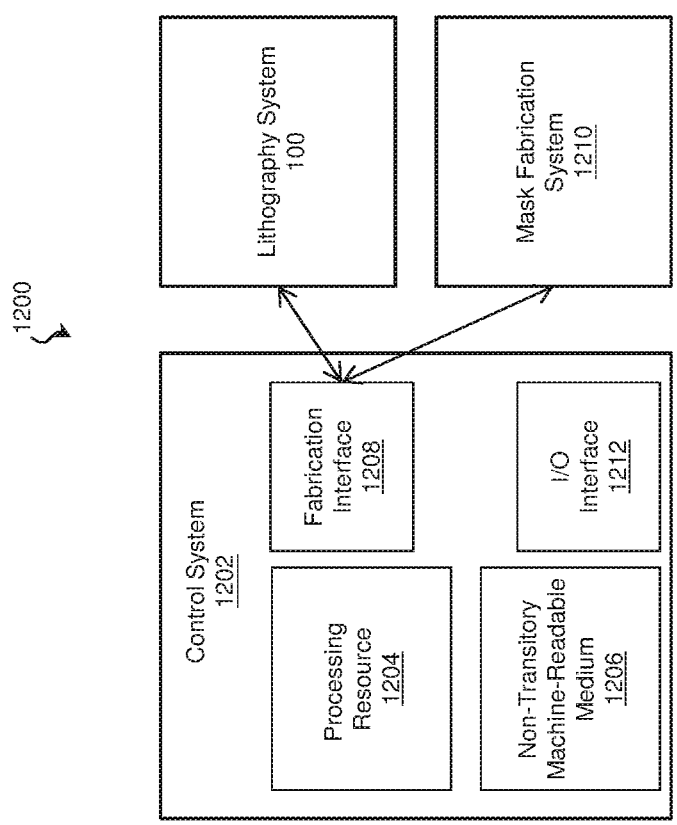
FIG. 12 is a block diagram of a lithographic environment according to various embodiments of the present disclosure.

In various embodiments, the technique is performed by using combinations of dedicated, fixed-function computing elements and programmable computing elements executing software instructions. Accordingly, it is understood that any of the steps of method 200 and/or method 800 may be implemented by a computing system using corresponding instructions stored on or in a non-transitory machine-readable medium accessible by the processing system. Examples of such a system and non-transitory machine-readable medium are described with reference to FIG. 12. In that regard, FIG. 12 is a block diagram of a lithographic environment 1200 according to various embodiments of the present disclosure.

The lithographic environment 1200 includes a control system 1202. The control system 1202 includes a processing resource 1204 that may include any number and type of processing elements such as Central Processing Units (CPUs), Graphical Processing Units (GPUs), Application-Specific Integrated Circuits (ASIC s), microcontrollers, and/or other suitable processing elements. The processing resource 1204 is coupled to a tangible non-transitory machine-readable medium 1206 to execute instructions stored on the medium 1206. For the purposes of this description, the tangible non-transitory machine-readable medium 1206 may be any apparatus that can store the program for use by or in connection with the instruction execution system, apparatus, or device. The medium 1206 may include non-volatile memory including magnetic storage, solid-state storage, optical storage, cache memory, and/or battery-backed Random Access Memory (RAM). In various examples, the medium 1206 stores instructions that cause the processing resource 1204 to perform the processes of method 200 of defining a mask for fabricating an integrated circuit and/or the processes of method 800 of fabricating the mask.

For that purpose, the control system 1202 may include a fabrication interface 1208 that sends and receives signals to a lithography system 100 and/or a mask fabrication system 1210. The control system 1202 may also include an I/O interface 1212 for communicating test information and results with a user and/or other computing systems. Accordingly the I/O interface 1212 may include controllers for video output (e.g., a GPU), user input (e.g., controllers for a keyboard, a mouse, a pen input device, a touchpad, etc.), network controllers (e.g., Ethernet and/or wireless communication controllers), and/or other suitable I/O controllers.

Thus, the present disclosure provides examples of a system and technique for performing optical proximity correction and for forming a photomask. In some examples, a method includes receiving a layout that includes a shape to be formed on a photomask. A plurality of target lithographic contours are determined for the shape that includes a first target lithographic contour for a first set of process conditions and a second target lithographic contour that is different from the first target lithographic contour for a second set of process conditions. A lithographic simulation of the layout is performed to produce a first simulated contour at the first set of process conditions and a second simulated contour at the second set of process conditions. A first edge placement error is determined between the first simulated contour and the first target lithographic contour and a second edge placement error is determined between the second simulated contour and the second target lithographic contour. A modification to the layout is determined based on the first edge placement error and the second edge placement error; and the layout with the modification is provided for fabricating the photomask. In some such examples, the first set of process conditions corresponds to optimal process conditions, and the second set of process conditions includes a process condition that varies from an optimal value. In some such examples, the second target lithographic contour is based on a simulation of the layout at a third set of process conditions that is different from the second set of process conditions. In some such examples, the second set of process conditions includes a process condition that varies from an optimal value, and the third set of process conditions includes the optimal value. In some such examples, the plurality of target lithographic contours further includes a third target lithographic contour for a fourth set of process conditions, the performing of the lithographic simulation of the layout further produces a third simulated contour at the fourth set of process conditions, and the third set of process conditions includes a value that is an average of a value of the second set of process conditions and a value of the fourth set of process conditions. In some such examples, the third target lithographic contour is based on the simulation of the layout at the third set of process conditions. In some such examples, the determining of the modification to the layout includes cost minimization analysis of a plurality of possible modifications to the layout. In some such examples, the cost minimization analysis includes determining a cost of each of the plurality of possible modifications based on edge placement errors associated with the respective modification at the first set of process conditions and the second set of process conditions. In some such examples, the cost is based on a sum of squares of the first edge placement error and the second edge placement error.

In further examples, a method includes receiving a layout for fabricating a mask. A plurality of target contours are determined corresponding to a plurality of sets of process conditions, wherein a first contour of the plurality of target contours is different from a second contour of the plurality of target contours. for each of a plurality of potential modification to the layout: a lithographic process of the respective potential modification at the plurality of sets of process conditions is simulated to produce a plurality of simulated contours, edge placement errors are determined based on the plurality of simulated contours and the plurality of target contours, and a cost is associated with the respective potential modification based on the edge placement errors. The layout and a modification of the plurality of potential modifications having a lowest associated cost are provided for fabricating the mask. In some such examples, the second contour of the plurality of target contours corresponds to a second set of process conditions and is based on simulating the layout at a third set of process conditions that is different from the second set of process conditions. In some such examples, the second set of process conditions includes a value for a process parameter that varies from an optimal value for the process parameter, and the third set of process conditions includes the optimal value. In some such examples, the third set of process conditions includes a value that is an average of a subset of the plurality of sets of process conditions that includes the second set of process conditions. In some such examples, the cost is further based on a fabrication penalty associated with the respective potential modification. In some such examples, the cost is based on a sum of squares of the edge placement errors.

In yet further examples, a method includes receiving a layout that includes a shape corresponding to a feature to be formed on a workpiece. An optical proximity correction process is performed on the layout is determined by: determining a plurality of target contours for the shape corresponding to process conditions within a process window, where a first contour of the plurality of target contours is different from a second contour of the plurality of target contours; simulating a plurality of potential modifications to the layout at the process conditions within the process window to produce simulated contours; and evaluating costs of the plurality of potential modifications based on comparing the simulated contours to the plurality of target contours. The layout and a modification of the plurality of potential modifications having a lowest cost are provided for fabricating a photomask for forming the feature on the workpiece. In some such examples, the process conditions include a first set that corresponds to optimal process conditions and a second set that includes a value that varies from an optimal value. In some such examples, the second set includes a first value for a first process parameter that varies from a first optimal value and a second value for a second process parameter that varies from a second optimal value. In some such examples, a target contour of the plurality of target contours corresponding to the second set is based on a simulation of the layout at a third set of process conditions that includes the first value for the first process parameter and the second optimal value for the second process parameter. In some such examples, the costs are based on edge placement errors between the simulated contours and the plurality of target contours.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a layout for fabricating a mask;
   determining a plurality of target contours corresponding to a plurality of sets of lithographic process conditions, wherein at least two of the plurality of target contours are different;
   determining a modification to the layout;
   simulating the modification to the layout under the plurality of sets of lithographic process conditions to produce a plurality of simulated contours;
   determining a cost of the modification to the layout based on comparisons between the plurality of simulated contours and corresponding ones in the plurality of target contours; and
   providing the modification to the layout for fabricating the mask based at least in part on the cost being within a predetermined threshold.

2. The method of claim 1, wherein determining the cost includes:
calculating edge placement errors between the plurality of simulated contours and corresponding ones in the plurality of target contours.

3. The method of claim 2, wherein determining the cost also includes:
adding weighing factors to the edge placement errors based on the plurality of sets of lithographic process conditions.

4. The method of claim 2, wherein determining the cost also includes:
determining penalties based on the modification to the layout under the plurality of sets of lithographic process conditions.

5. The method of claim 1, wherein the providing of the modification to the layout for fabricating the mask is also based on the modification to the layout meeting a design rule.

6. The method of claim 1, wherein the plurality of sets of lithographic process conditions are different from each other.

7. The method of claim 6, wherein one of the plurality of sets of lithographic process conditions corresponds to optimal lithographic process conditions.

8. The method of claim 6, wherein one of the plurality of sets of lithographic process conditions includes at least a lithographic process condition that has a non-optimal value.

9. The method of claim 6, wherein one of the plurality of sets of lithographic process conditions includes at least a lithographic process condition that is an average of multiple non-optimal values.

10. The method of claim 1, wherein the lithographic process conditions at least include lithographic dose variations and focus variations.

11. A method comprising:
receiving a layout for fabricating a mask;
determining a plurality of target contours corresponding to a plurality of sets of lithographic process conditions within a lithographic process window, wherein a first contour of the plurality of target contours is different from a second contour of the plurality of target contours;
for each of a plurality of potential modifications to the layout:
simulating a lithographic process of the respective potential modification at the plurality of sets of lithographic process conditions to produce a plurality of simulated contours;
determining edge placement errors based on comparisons between the plurality of simulated contours and corresponding ones in the plurality of target contours; and
associating a cost with the respective potential modification based at least on the edge placement errors; and
providing, for fabricating the mask, one of the plurality of potential modifications that is associated with a smallest value of the cost.

12. The method of claim 11, wherein the first contour of the plurality of target contours corresponds to a first set of lithographic process conditions including optimal values.

13. The method of claim 12, wherein the second contour of the plurality of target contours corresponds to a second set of lithographic process conditions including at least one non-optimal value.

14. The method of claim 12, wherein the second contour of the plurality of target contours corresponds to a second set of lithographic process conditions including an average of a plurality of non-optimal values.

15. The method of claim 11, wherein the cost is further based on a fabrication penalty associated with the respective potential modification.

16. The method of claim 11, wherein the cost is based on a sum of squares of the edge placement errors.

17. A method, comprising:
receiving a layout that includes a shape corresponding to a physical feature in an integrated circuit;
determining a plurality of target contours corresponding to a plurality of sets of lithographic process conditions, wherein the sets of lithographic process conditions are different from each other;
performing a first plurality of lithographic simulations based on a first modification to the layout under the plurality of sets of lithographic process conditions to produce a first plurality of simulated contours;
performing a second plurality of lithographic simulations based on a second modification to the layout under the plurality of sets of lithographic process conditions to produce a second plurality of simulated contours;
calculating a first cost of the first modification based on comparisons between the first plurality of simulated contours and corresponding ones in the plurality of target contours;
calculating a second cost of the second modification based on comparisons between the second plurality of simulated contours and corresponding ones in the plurality of target contours;
selecting one of the first and second modifications based on a smaller one of the first and second costs; and
providing the layout and the selected one of the first and second modifications for fabricating a mask in association with the integrated circuit.

18. The method of claim 17, wherein the lithographic process conditions include parameters selected from the group consisting of mask error, focus variation, and lithographic dose variation.

19. The method of claim 17, wherein one of the plurality of sets of lithographic process conditions corresponds to optimal lithographic process conditions, and another one of the plurality of sets of lithographic process conditions includes at least a lithographic process condition that is non-optimal.

20. The method of claim 17, wherein the calculating of the first and second costs is further based on a fabrication penalty associated with the respective modification.

* * * * *